(12) United States Patent
Tsutsumi et al.

(10) Patent No.: US 6,420,659 B1
(45) Date of Patent: Jul. 16, 2002

(54) FLEXIBLE WIRING BOARD PIECES AND WIRING SHEETS

(75) Inventors: Akira Tsutsumi; Hideyuki Kurita, both of Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/610,308

(22) Filed: Jul. 5, 2000

(30) Foreign Application Priority Data

Jul. 12, 1999 (JP) .......................................... 11-197834

(51) Int. Cl.$^7$ .............................. H05K 1/00; H05K 1/03
(52) U.S. Cl. ........................ 174/254; 174/255; 174/268; 174/72 A; 361/749; 360/254.9
(58) Field of Search ................................. 174/254, 255, 174/268, 72 A; 361/749, 750, 751; 360/245.9

(56) References Cited

U.S. PATENT DOCUMENTS 5,309,316 A * 5/1994 Yagi et al. .................. 361/749
5,821,626 A * 10/1998 Ouchi et al. ................ 257/778
5,844,753 A * 12/1998 Inaba ......................... 360/104
5,995,329 A * 11/1999 Shiraishi et al. ............ 360/104

* cited by examiner

Primary Examiner—Jeffrey Gaffin
Assistant Examiner—Quynh-Nhu H. Vu
(74) Attorney, Agent, or Firm—Oliff & Berridge, PLC

(57) ABSTRACT

A flexible wiring board piece which can prevent a short circuit because of scattering of the connecting terminal parts and facilitate cutting when cut at an intermediate connecting terminal part. A constitution wherein circuit wiring patterns 13 [$13_1$–$13_4$] are coated with insulating films 11 and 14; connecting terminal parts 17 of the circuit wiring patterns 13 and cut parts 18 of the circuit wiring patterns 13, which are located apart form the connecting terminal parts 17, are exposed in both faces via openings 20a, 20b, 21a and 21b formed in insulating films 11 and 14; and narrow parts for cutting are formed in the cut parts 18 facing the openings 20b and 20b.

15 Claims, 14 Drawing Sheets

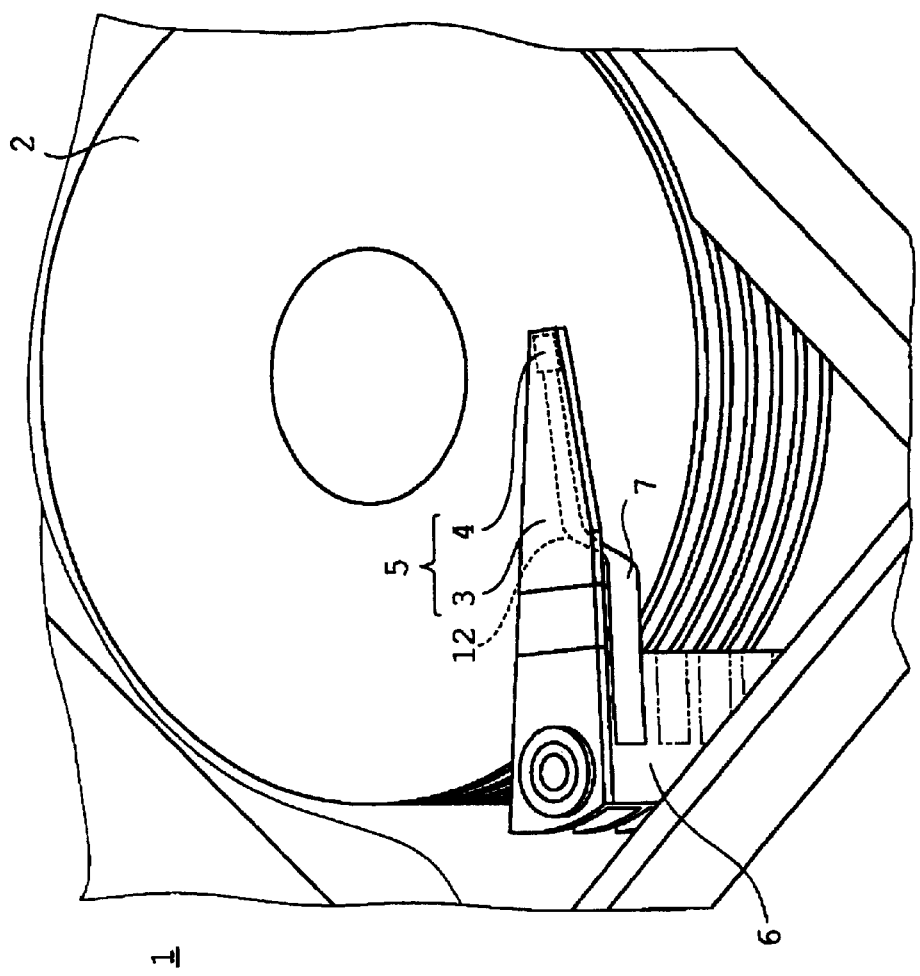

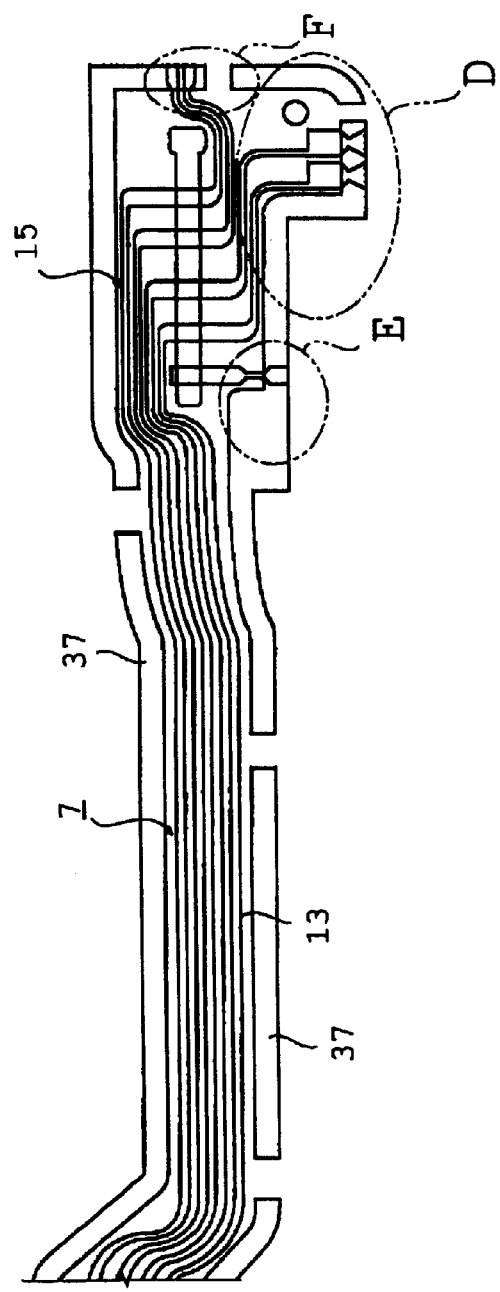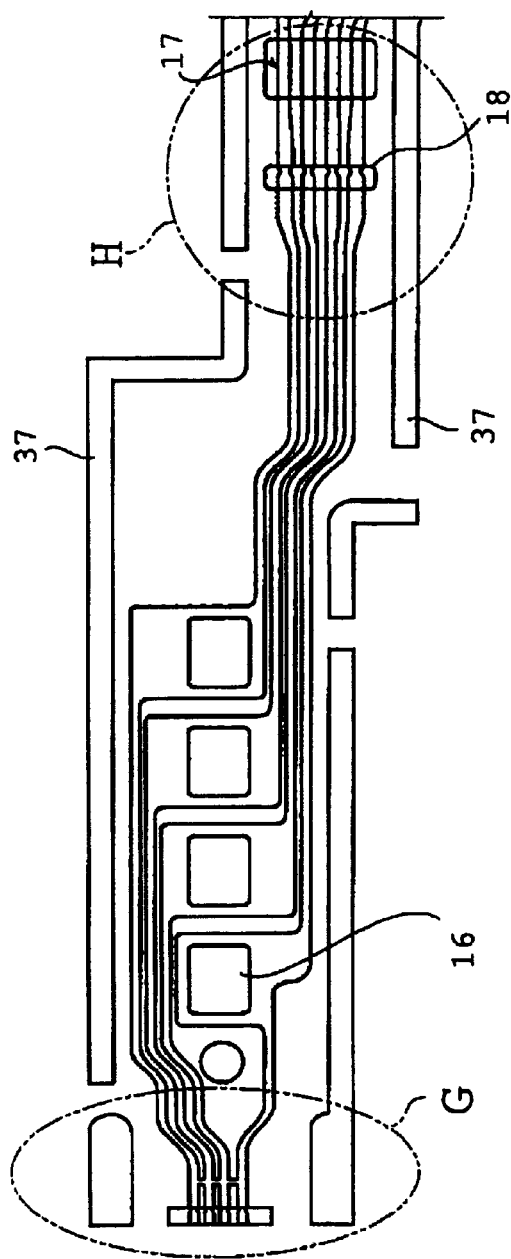
FIG. 7A
FIG. 7B

FLEXIBLE WIRING BOARD PIECES AND WIRING SHEETS

FIELD OF THE INVENTION

This invention relates to flexible wiring board pieces to be used in electronic instruments and the like.

This invention also relates to wiring sheets having plural flexible wiring board pieces which are aligned in a separable manner.

BACKGROUND OF THE INVENTION

Electronic instruments such as hard disk drive units are provided with a so-called head stack assembly consisting of plural so-called head ginbal assemblies, which have magnetic heads at the tip of the gimbals and superposed upon each other, corresponding to plural hard disks in a laminated state. The magnetic heads of the head ginbal assemblies constituting the head stack assembly are each electrically connected to an actuator part having a semiconductor integrated circuit (IC) mounted thereon via a flexible wiring board piece serving as a relay wiring board.

This flexible wiring board piece consists of a plural wiring patterns which are coated with an insulating film except at connecting terminal parts located at both ends.

In the flexible wiring board piece to be used in hard disk drive units as described above, each wiring pattern is extended to form a test pad. After measuring the characteristics of the magnetic head, etc. by using the test pad, the test pad is removed by cutting at one connecting terminal part substantially connected to the actuator part.

In this flexible wiring board piece, it is necessary to prevent the connecting terminal parts exposed outside from being scattered and being short-circuited among the connecting terminal parts, when it is cut at the intermediate part (i.e., the so-called connection-cut terminal part). It is also necessary to prevent a short circuit among the connecting terminal parts caused by the formation of a flash at the cut part.

In addition, it is necessary that a flexible wiring board piece can be easily and stably cut, since it should be cut in a small space.

These flexible wiring board pieces are shipped as such in some cases. Otherwise these pieces are aligned on sheets, shipped in the form of wiring sheets, and then separated by users before using. When processed into wiring sheets, it is therefore desired that these flexible wiring board pieces can be easily separated.

SUMMARY OF THE INVENTION

Under these circumstances, the present invention provides flexible wiring board pieces which can be easily cut at the connecting terminal part without causing a short circuit among connecting terminal parts.

The present invention further provides wiring sheets from which flexible wiring board pieces can be easily separated.

A flexible wiring board piece according to the present invention is provided with: at least one circuit wiring pattern made of a conductor foil and having a connecting terminal part; and insulating films formed so as to coat both faces of the circuit wiring pattern and each having a first opening for exposing both faces of the connecting terminal part of the circuit wiring pattern and a second opening for exposing both faces of the cut part of the circuit wiring pattern at a site apart from the first opening.

This invention is regarding the flexible wiring board piece wherein a narrow part for cutting is formed in the cut part of the circuit wiring pattern facing the second opening of the insulating films.

This invention is regarding the flexible wiring board piece wherein the narrow part for cutting is formed in the vicinity of the opening edges of the insulating films.

In the flexible wiring board piece according to the present invention, the connecting terminal part and the cut part are provided in such a manner as being exposed in both faces from openings, which are apart from each other, formed in the insulating films. Thus, the flexible wiring board piece is cut not at the connecting terminal part but at the cut part apart from the connecting terminal part. When the flexible wiring board piece is cut, the free end of the connecting terminal part is coated with the insulating films. Owing to this constitution, connecting terminal parts which are exposed in both faces are not scattered after cutting and thus there arises no short circuit among these connecting terminal parts.

When a narrowing part for cutting is formed in the cut part of a circuit wiring pattern facing one of the openings, the flexible wiring board piece can be easily out by hand.

When this narrow part for cutting is formed in the vicinity of the opening edges of the insulating films, the circuit wiring pattern is cut at the opening edges of the insulating films. In this case, little flash is formed and the circuit wiring pattern scarcely undergoes a short circuit at the cut part after cutting.

A wiring sheet according to the present invention is provided with: a circuit wiring pattern having plural patterns constituting at least one flexible wiring board piece made of a conductor foil and having a connecting terminal part; insulating sheets formed so as to coat both faces of the circuit wiring pattern and having perforations in a part corresponding to the periphery of the flexible wiring board piece; and a plating lead wire for electrically connecting the circuit wiring pattern being exposed on both faces thereof and having a narrow part for cutting in the exposed part.

This invention is regarding the wiring sheet wherein the plating lead wire is formed in the perforated part.

This invention is regarding the wiring sheet wherein the circuit wiring pattern further has a first opening for exposing both faces of the connecting terminal part and a second opening for exposing both faces of the cut part of the circuit wiring pattern at a site apart from the first opening.

This invention is regarding the wiring sheet wherein a narrow part for cutting is formed in the cut part of the circuit wiring pattern facing the second opening of the insulating sheets.

This invention is regarding the wiring sheet wherein the narrow part for cutting is formed in the vicinity of the opening edges of the insulating sheets.

In the wiring sheet according to the present invention, plating lead wires are formed so as to connect aligned adjacent circuit wiring patterns constituting flexible wiring board pieces to each other. Therefore, the desired parts of the circuit wiring patterns of the flexible wiring board pieces can be metal-plated at once in the production process.

In this wiring sheet, a narrow part for cutting is formed in each plating lead wire under exposure and the insulating sheets are perforated in the parts corresponding to the periphery of each flexible wiring board piece. Owing to this constitution, each flexible wiring board piece can be separated from the wiring sheet by hand along the perforations.

By forming a plating lead wire in the perforated part so as to exposed it in both faces, the plating lead wire can be cut along the perforations.

BRIEF DESCRIPTION OF THE DRAWINGS

FIG. 1 is a view illustrating the constitution of the major part of a hard disk drive unit to which the flexible wiring board piece according to the present invention is applied.

FIG. 7A is an enlarged view of major part of one of the flexible wiring board pieces of the wiring sheet of FIG. 6, and FIG. 7B is another enlarged view of major part of one of the flexible wiring board pieces of the wiring sheet of FIG. 6.

Figure 2A:
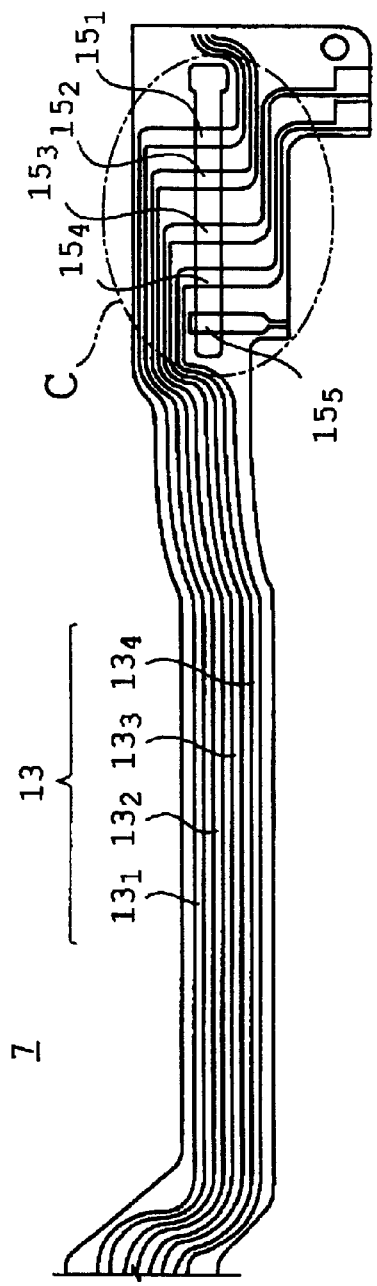
FIG. 2A is a view illustrating the constitution of the major part of the flexible wiring board piece according to an embodiment of the present invention.
Figure 2B:
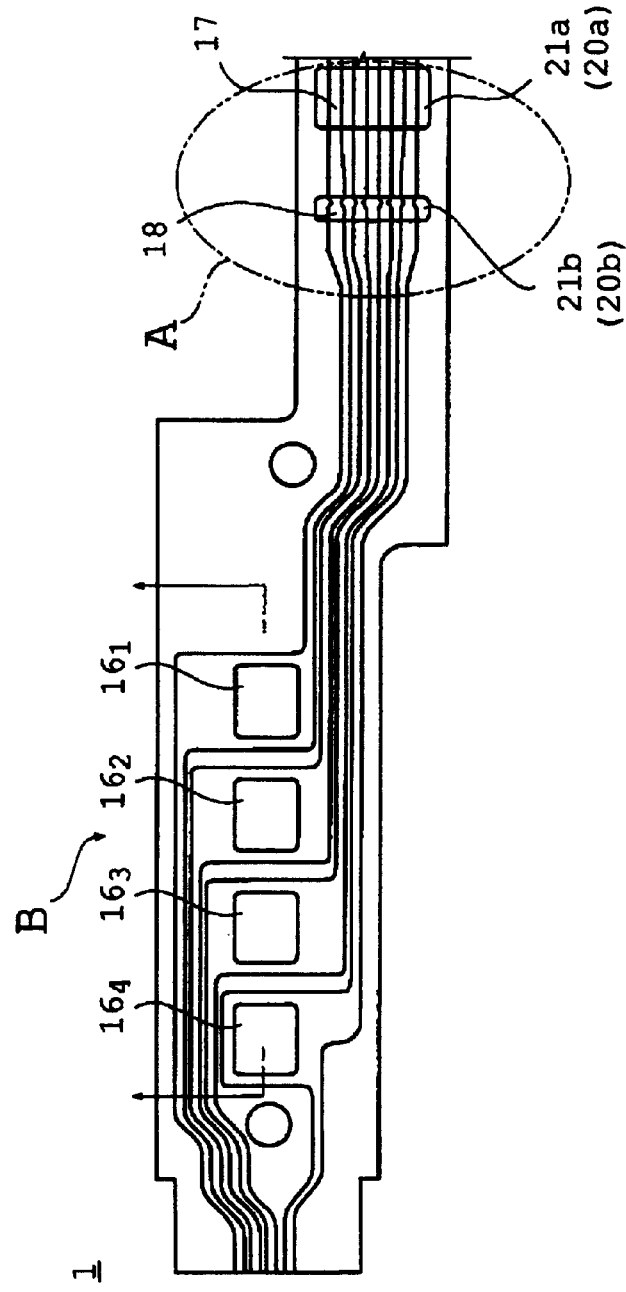
FIG. 2B is another view illustrating the constitution of the major part of the flexible wiring board piece according to the embodiment of the present invention.
Figure 2C:
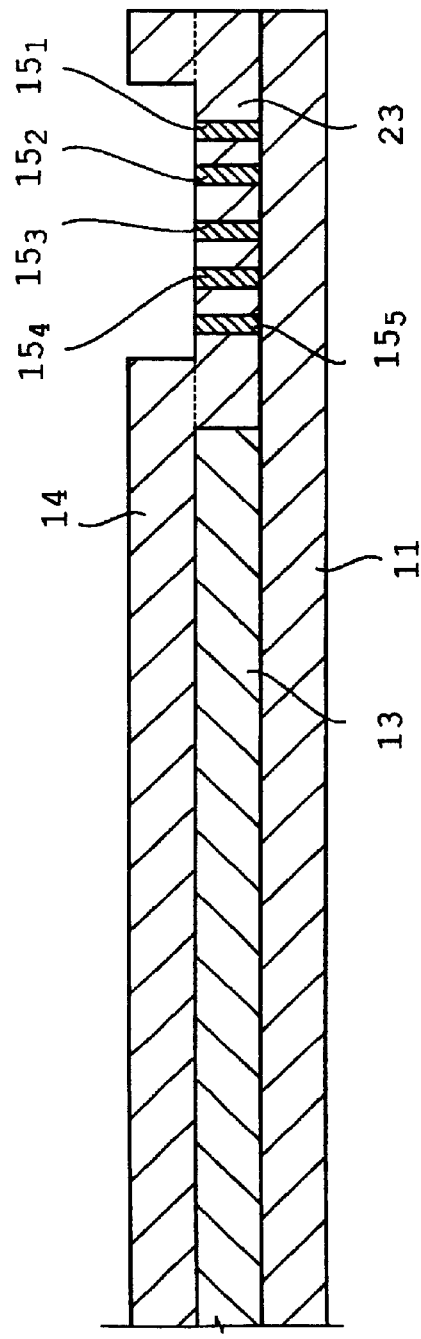
FIG. 2C is a section view of FIG. 2A.
Figure 2D:
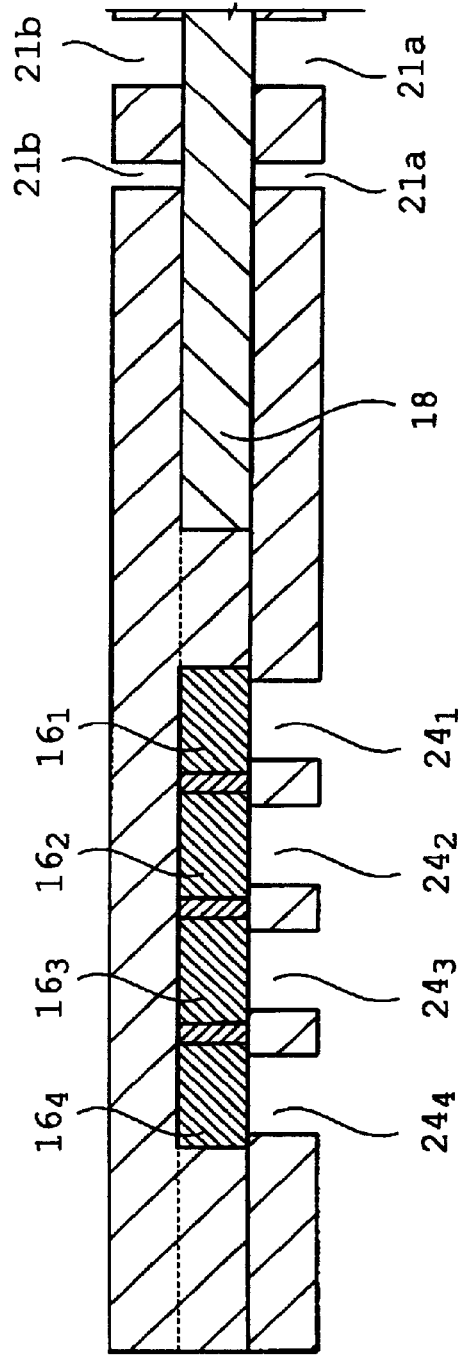
FIG. 2D is a section view of FIG. 2B.

In these figures, each reference numeral has the following meaning:

1: hard disk drive unit; 2: hard disk; 3: ginbal; 4: magnetic head; 5: head ginbal assembly; 6: actuator; 7:flexible wiring board piece; 11: insulating film sheet; 13 [$13_1$–$13_4$]: circuit wiring pattern; 14: insulating cover coat layer; 15 [$15_1$–$15_4$]: connecting terminal part in one side; 16 [$16_1$–$16_4$]: test pad; 17 [$17_1$–$17_4$]: connecting terminal part in the other side; 18 [$18_1$–$18_4$]: cut part; 20a, 20b, 21a, 21b, 23, 24 [$24_1$–$24_4$]: opening; 26: narrow part; 27: notch; 36 [$36_1$–$36_9$]: plating lead wire; 37: perforation; 38: narrow part.

DETAILED DESCRIPTION OF THE INVENTION

Now, the embodiment modes of the present invention will be illustrated by reference to the attached drawings.

FIG. 1 is a view illustrating the constitution of the major part of a hard disk drive unit to which the flexible wiring board piece according to the present invention is applied.

In this hard disk drive unit 1, plural hard disks 2 serving as recording media are laminated at definite intervals. In the vicinity of each of the hard disk 2, a so-called head ginbal assembly 5 having a magnetic head 4 at the tip of the ginbal 3 is provided corresponding to each hard disk 2. These head ginbal assemblies 5 are laminated each other and provided as a single head stack assembly.

The magnetic head of each of the head ginbal assemblies 5 constituting the head stack assembly is electrically connected to an actuator part 6 having a semiconductor integrated circuit (IC) mounted thereon via the flexible wiring board piece 7 according to the present invention each serving as a relay wiring board as will be described hereinafter.

Figure 3A:
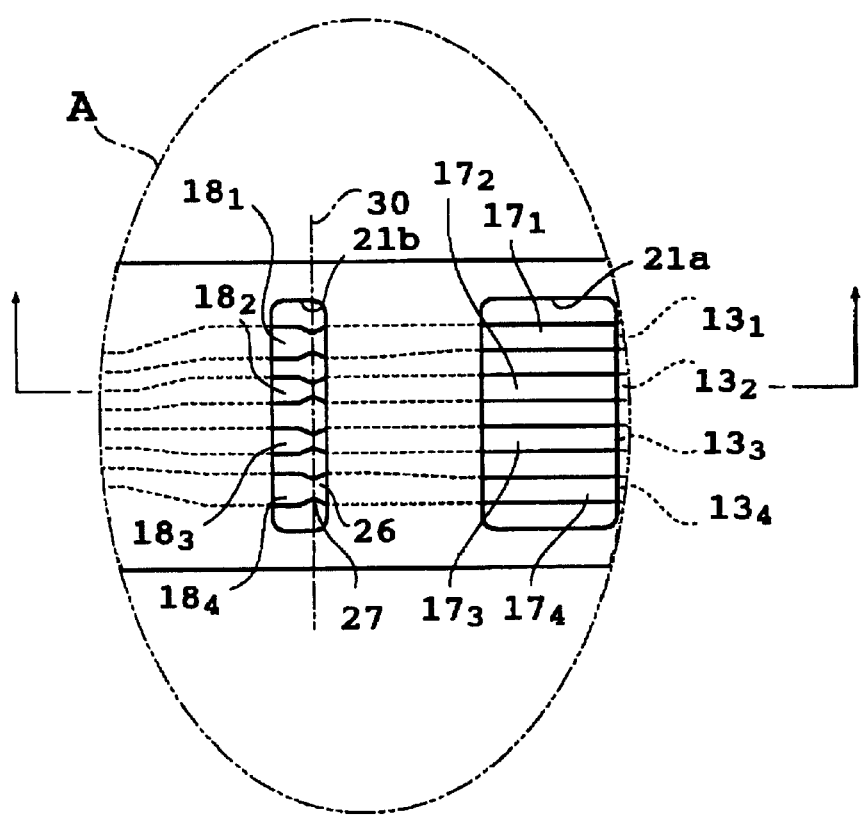
FIG. 3A is an enlarged view of the part A in FIG. 2.
Figure 3B:
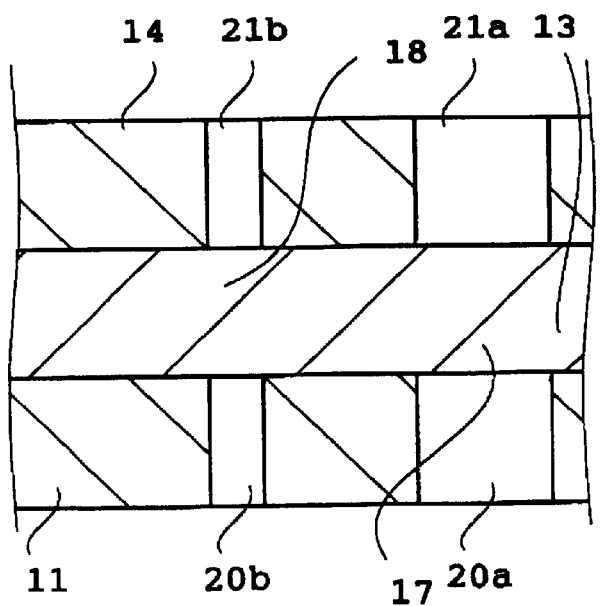
FIG. 3B is a section view of FIG. 3A.
Figure 4A:
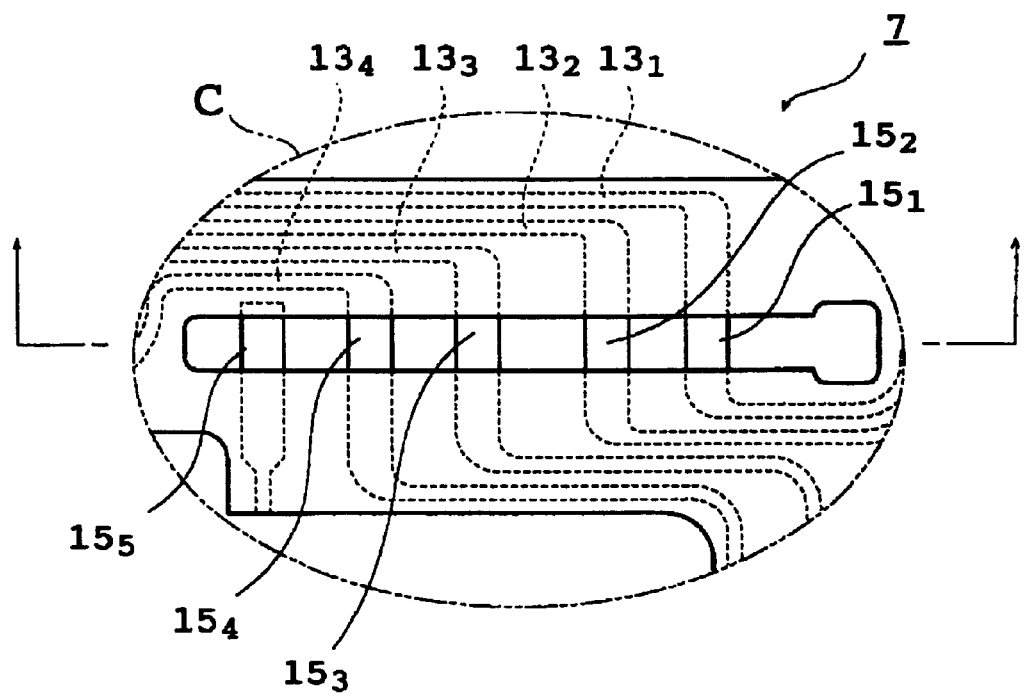
FIG. 4A is an enlarged view of the part C in FIG. 2.
Figure 4B:
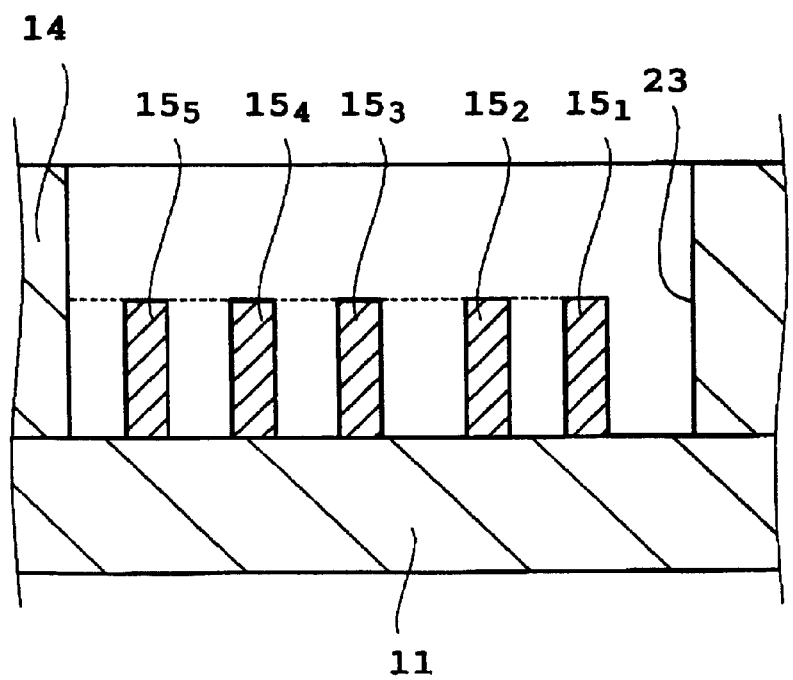
FIG. 4B is a section view of FIG. 4A.
Figure 5:
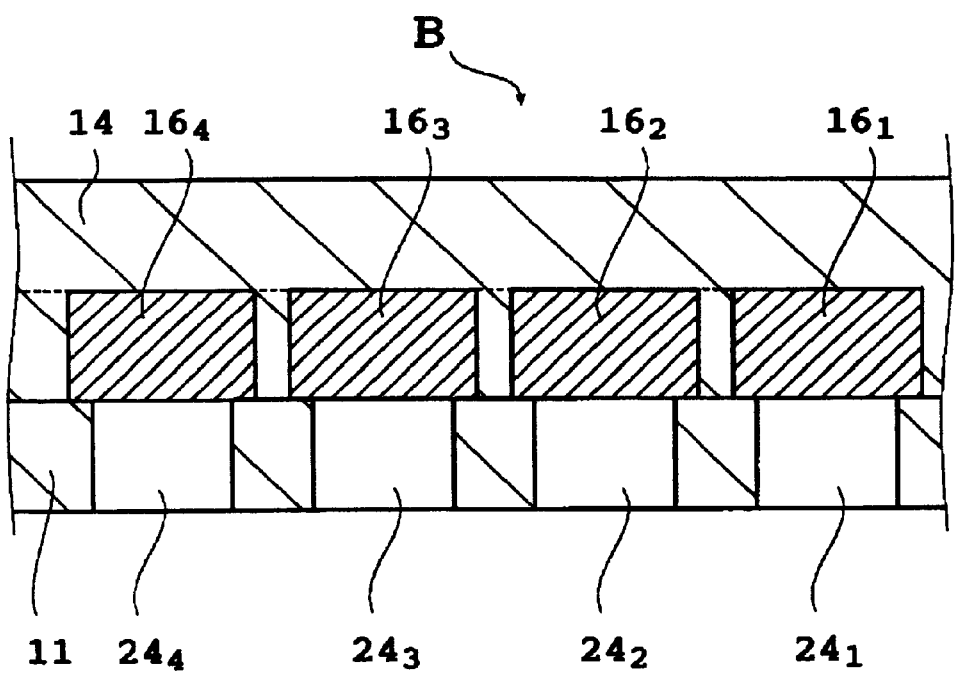
FIG. 5 is an enlarged section view of the part B in FIG. 2.

FIGS. 2A, 2B, 2C and 2D are views illustrating the flexible wiring board piece according to the present invention as a whole. FIG. 3A is an enlarged view of the part A in FIG. 2, and FIG. 3B is a section view of FIG. 3A. FIG. 4A is an enlarged view of the part C in FIG. 2, and FIG. 4B is a section view of FIG. 4A. FIG. 5 is an enlarged section view of the part B in FIG. 2.

In the flexible wiring board piece 7 according to an embodiment of the present invention, a circuit wiring pattern 13 consisting of plural wires (4 parallel wires in this example, i.e., $13_1$, $13_2$, $13_3$ and $13_4$) is formed along the shape of a long and narrow insulating film base 11 having a definite planar shape. The film base including the circuit wiring pattern 13 is coated with an insulating film, namely, a so-called insulating cover coat layer 14.

That is to say, this flexible wiring board piece 7 has a so-called sandwich structure wherein the circuit wiring pattern 13 is coated on both faces with the insulating film base 11 and the insulating cover coat layer 14.

In the flexible wiring board piece 7, connecting terminal parts 15 [$15_1$, $15_2$, $15_3$ and $15_4$] of the wires $13_1$, $13_2$, $13_3$ and $13_4$ are respectively formed in one end, while test pads 16 [$16_1$, $16_2$, $16_3$ and $16_4$] which may be brought into contact with measurement probes are formed at the other end. At the intermediate part of the flexible wiring board piece 7, the other connecting terminal parts 17 [$17_1$, $17_2$, $17_3$ and $17_4$] of the wires $13_1$, $13_2$, $13_3$ and $13_4$ are further formed. Also, cut parts 18 [$18_1$, $18_2$, $18_3$ and $18_4$] of the circuit wiring pattern, which are to be cut later, are formed at a site somewhat apart from the connecting terminal parts 17. The reference numeral $15_5$ stands for a dummy connecting terminal part.

Further, openings 20a and 20b are formed in the insulating film 11 in the parts corresponding to the connecting part 17 and the cut part 18 respectively and openings 21a and 21b are formed in the insulating cover coat layer 14 in the parts corresponding to the connecting part 17 and the cut parts 18 respectively. The connecting terminal parts $17_1$–$17_4$ in the other side are exposed outside in both faces due to these openings 20a and 21a, while the cut parts $18_1$–$18_4$ are exposed outside in both faces due to these openings 20b and 21b (see, FIGS. 3A and 3B).

The connecting terminal parts $17_1$–$17_4$ and the out parts $18_1$–$18_4$, which are thus formed so as to be exposed to the atmosphere, are called flying leads.

A narrow part 26 is each formed in the vicinity of the opening edge in the connecting terminal parts $17_1$–$17_4$ side of the cut parts $18_1$–$18_4$ of the wires $13_1$–$13_4$ to facilitate cutting. This narrow part 26 can be formed by providing a notch 27 (see FIG. 3A).

The circuit wiring pattern 13 is formed by plating a desired metal foil, for example, a copper (Cu) foil, with a desired metal, for example, gold (Au).

As FIGS. 4A and 4B show, the connecting terminal parts 15 [$15_1$, $15_2$, $15_3$ and $15_4$] in one side of the wires $13_1$, $13_2$, $13_3$ and $13_4$ and the dummy connecting terminal part $15_5$ is exposed outside via the opening 23 formed in the insulating cover coat layer 14.

As FIG. 5 shows, the test pads 16 [$16_1$, $16_2$, $16_3$ and $16_4$] are exposed outside via openings 24 [$24_1$, $24_2$, $24_3$ and $24_4$] formed in the insulating film base 11.

Figure 12A:
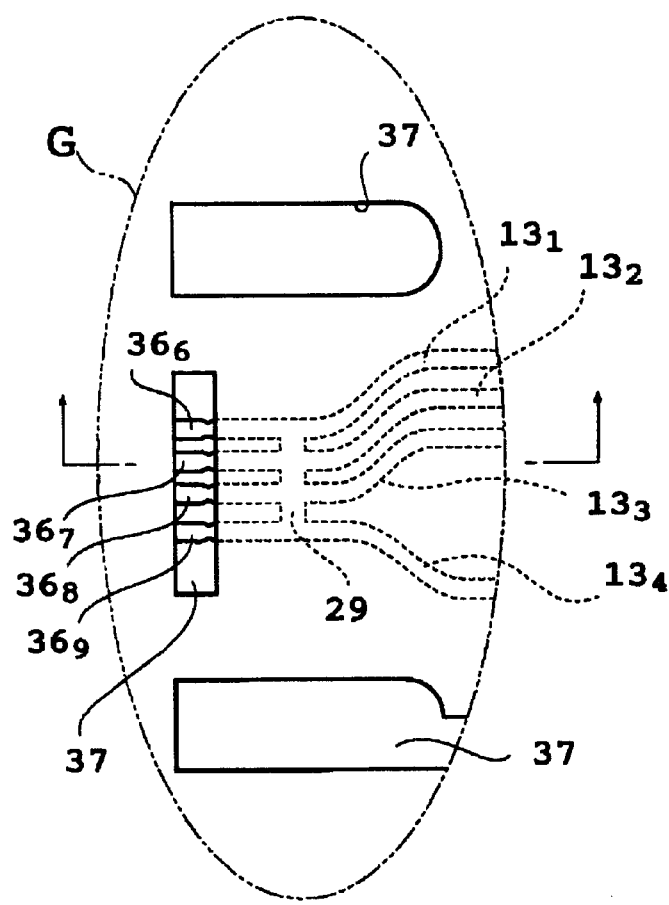
FIG. 12A is an enlarged view of the part G in FIG. 7.
Figure 12B:
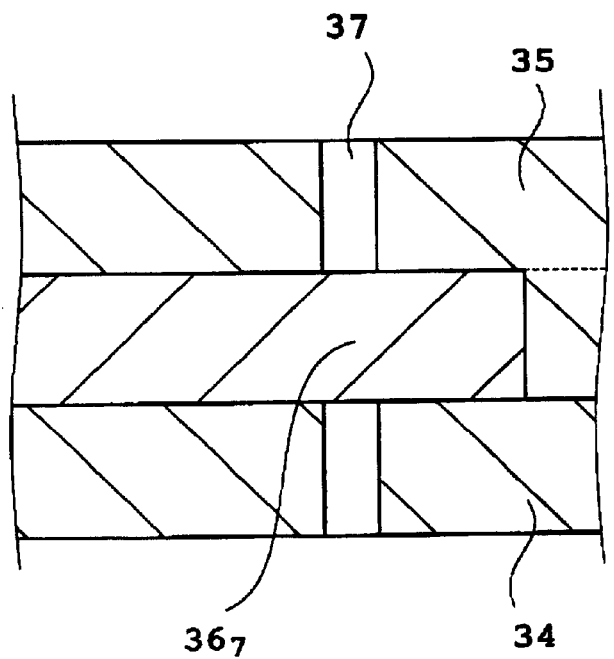
FIG. 12B is a section view of FIG. 12A.

To protect the magnetic head 4, which is less resistant to static electricity, from static electricity, the wires $13_1$, $13_2$, $13_3$ and $13_4$ are short-circuited with each other during the assembling process by using a connecting part 29 at the end of the side to be separated finally of the flexible wiring board piece 7 (see, FIG. 12A).

This flexible wiring board piece 7 can be constructed by, for example, the following method.

An insulating film base 11 coated in one face with a metal foil, for example, a Cu foil, is prepared. First, opening 20a, 20b and 24 [$24_1$, $24_2$, $24_3$ and $24_4$] are formed by selective etching at definite sites of the insulating film base 11.

Subsequently, the Cu foil is patterned by selective etching to form a circuit wiring pattern 13 consisting of wires $13_1$–$13_4$ having notches 27 at the cut parts $18_1$–$18_4$ as shown in FIG. 2A. If necessary, this circuit wiring pattern 13 is then plated with a metal such as gold.

Next, an insulating cover coat layer 14 is formed by the application method on the whole face of the insulating film base 11 including the circuit wiring pattern 13. Before the insulating cover coat layer 14 is hardened, openings 21a, 21b and 23 are formed by selective etching. Subsequently, the insulating cover coat layer 14 is hardened.

In the step of the formation of the insulating cover coat layer 14, a sheet is provided below the insulating film base 11 so that the insulating cover coat material dripping from the openings 20a and 20b of the insulating film base 11 is received by the sheet. After applying the insulating cover coat material, the sheet is peeled off. In the step of the selective etching for forming the openings 21a, 21b and 23 in the insulating cover coat layer 14, the cover coat material dripping from the openings 20a and 20b of the insulating film base is eliminated.

Thus, the flexible wiring board piece 7 is obtained.

As shown in FIG. 1, the flexible wiring board piece 7 is connected at one connecting terminal parts 15 [$15_1$–$15_4$] to the definite connection part of, for example, a magnetic head 4 of a head ginbal assembly 5 and bowed in a twisted manner from a curved part 12 to follow up the face of the head ginbal assembly 5. From the other connecting terminal parts 17 [$17_1$–$17_4$], the part in the test pads 16 [$16_1$–$16_4$] side is led outside. Then the other connecting terminal parts 17 [$17_1$–$17_4$] are electrically connected to an actuator part 6 having a semiconductor integrated circuit (IC) mounted thereon.

In the process of assembling this flexible wiring board piece 7, the wires $13_1$–$13_4$ of the circuit wiring pattern 13 are short-circuited at the end with each other at the connecting part 29. Thus, the magnetic head 4 is not affected by static electricity.

After the completion of the assembling of the flexible wiring board piece 7, the connecting part 29 is cut off and thus the wires $13_1$–$14_4$ are electrically separated. Next, the head ginbal assembly 5 including the magnetic head 4 is subjected to a characteristic test. This characteristic test is carried out by contacting the test pads 16 [$16_1$–$16_4$] of the flexible wiring board piece 7 with probes of a measurement instrument.

After the completion of the the characteristic test, the flexible wiring board piece 7 is cut along the chain line 30 as shown in FIG. 3A. By this treatment, the flexible wiring board piece 7 is cut at the narrow parts 26, i.e., the notches 27, formed in the vicinity of the opening edge in the cut part [$18_1$–$18_4$] of the wires 13 [$13_1$–$13_4$] facing the openings 20b and 21b.

In the case of the flexible wiring board piece 7 according to this embodiment of the present invention, two sets of openings (20a, 21a) and (20b, 21b) apart from each other are formed and wires are exposed in both faces via these openings (20a, 21a ) and (20b, 21b). Namely, two so-called flying lead parts apart from each other are provided. One of the flying lead parts serves as the connecting terminal parts 17 [$17_1$–$17_4$] while the other flying part serves as the cut parts 18 [$18_1$–$18_4$]. Owing to this constitution, when the flexible wiring board piece 7 is cut at the cut part 18 [$18_1$–$18_4$], the free ends at the connecting terminal part 17 [$17_1$–$17_4$] are not scattered but sandwiched between the insulating film base 11 and the insulating cover coat layer 14.

That is to say the positioning relation among the connecting terminal parts $17_1$–$17_4$ is maintained after cutting and thus a short-circuit among the connecting terminal parts $17_1$–$17_4$ can be prevented. At the same time, the connecting terminal part 17 is prevented from contact with other parts.

By forming narrow parts 26 by notches 27 in the cut parts $18_1$–$18_4$ of the wires $13_1$–$13_4$, the flexible wiring board piece 7 can be easily cut at the narrow parts 26.

When the notches 27 are formed in the vicinity of the edge of the opening (20b, 21b) in the connecting terminal part 17 side, moreover, no flash is formed after cutting and thus a short circuit among the wires $13_1$–$13_4$ in the cut part 18 can be surely prevented.

In the present invention, on the other hand, a wiring sheet having plural flexible wiring board pieces 7 aligned on a sheet is formed so that each flexible wiring board piece 7 can be separated from the wiring sheet by users.

Figure 6A:
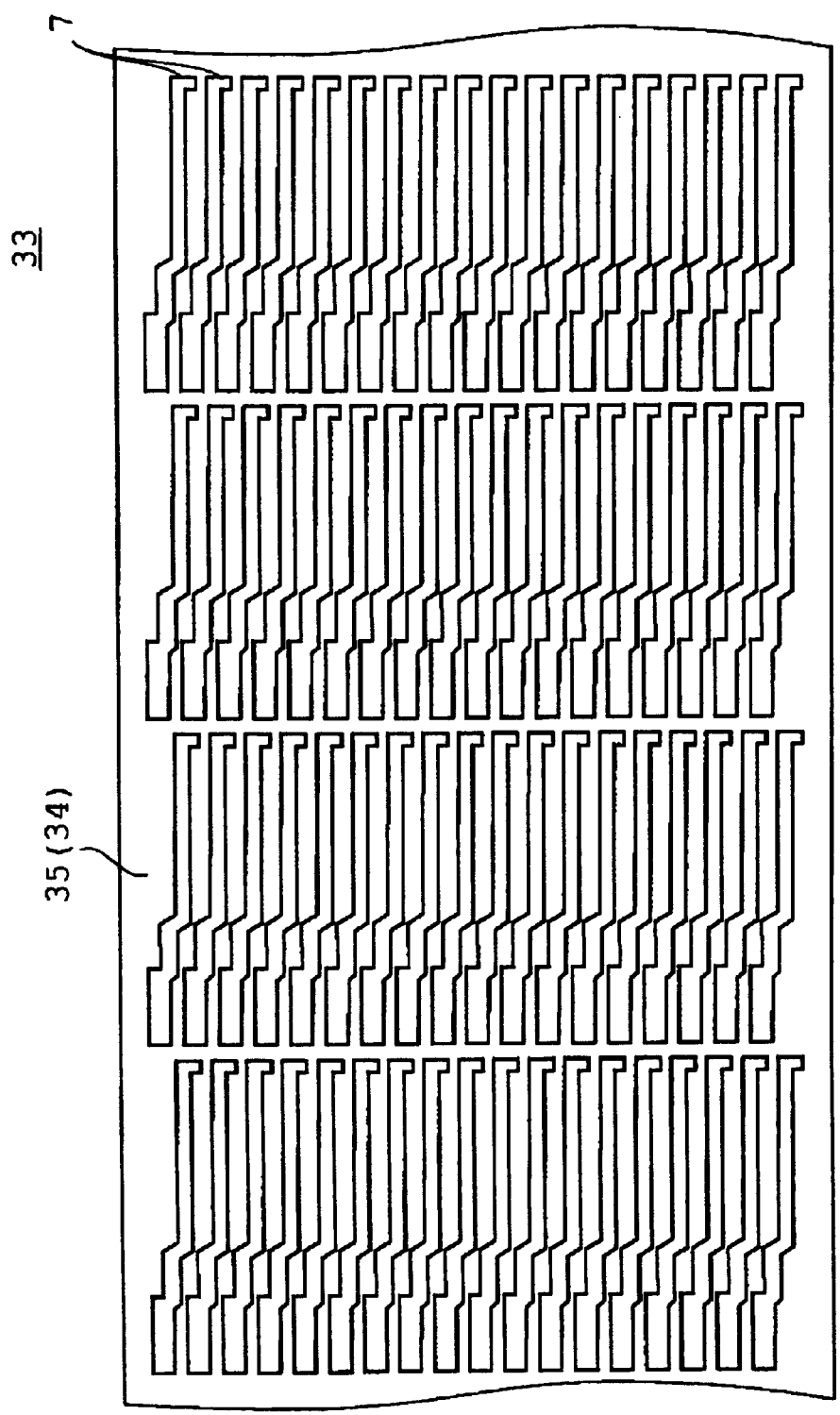
FIG. 6A is a view illustrating the constitution of the wiring sheet according to an embodiment of the present invention and FIG. 6B is a section view thereof.
Figure 6B:
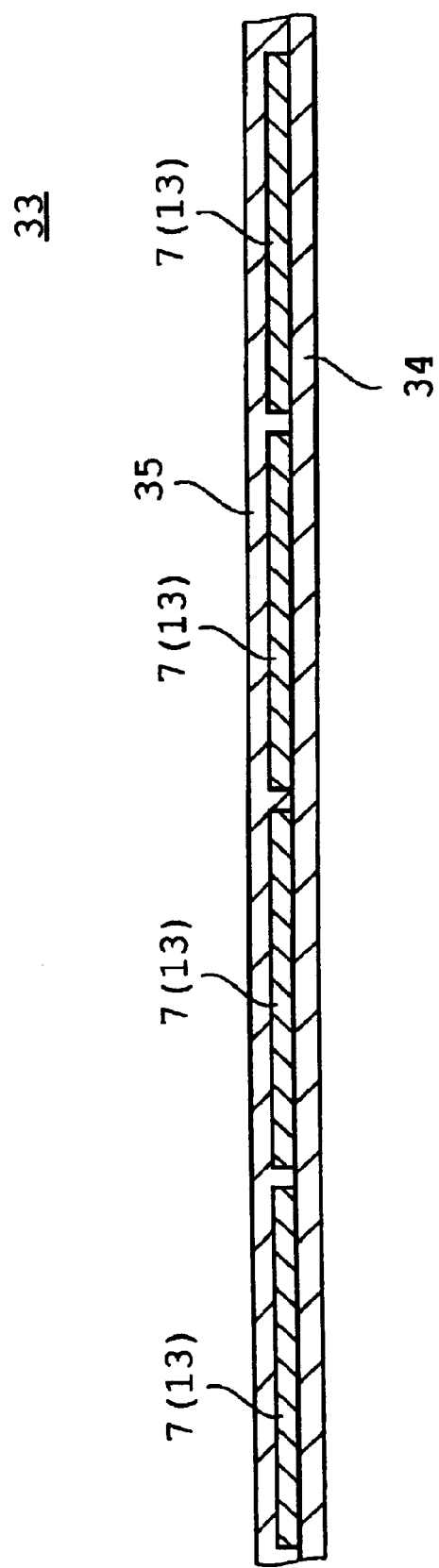
Figure 8A:
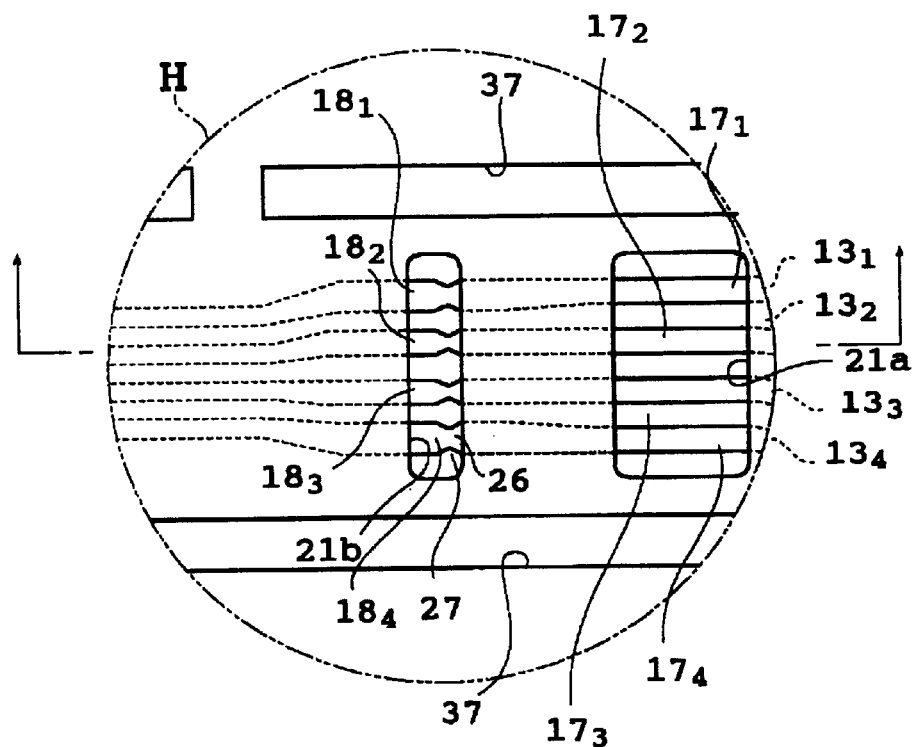
FIG. 8A is an enlarged view of the part H in FIG. 7.
Figure 8B:
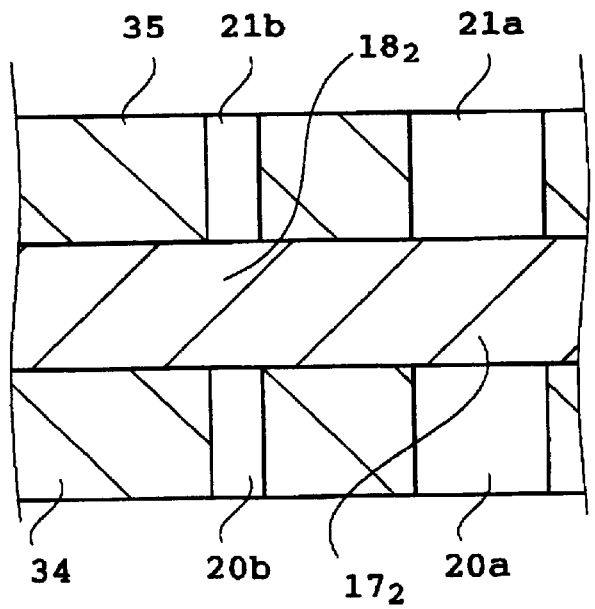
FIG. 8B is a section view of FIG. 8A.
Figure 9A:
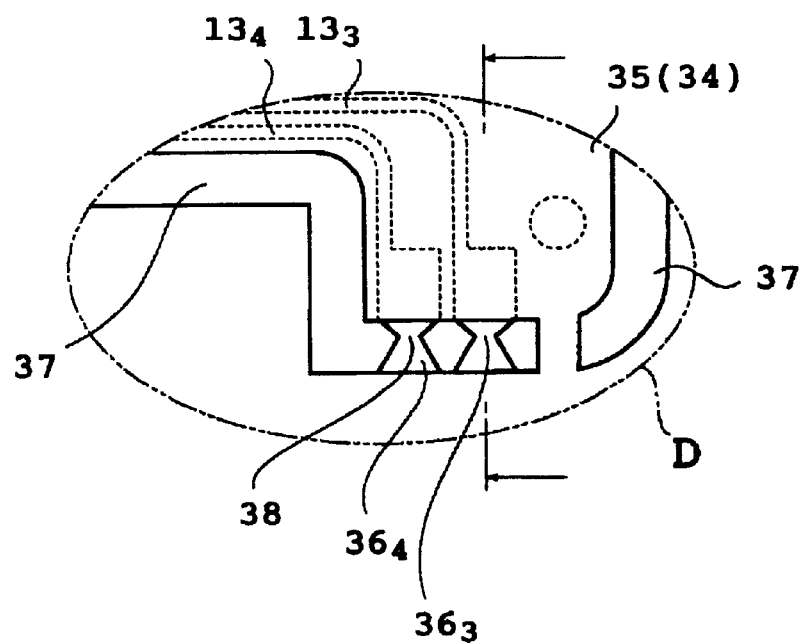
FIG. 9A is an enlarged view of the part D in FIG. 7.
Figure 9B:
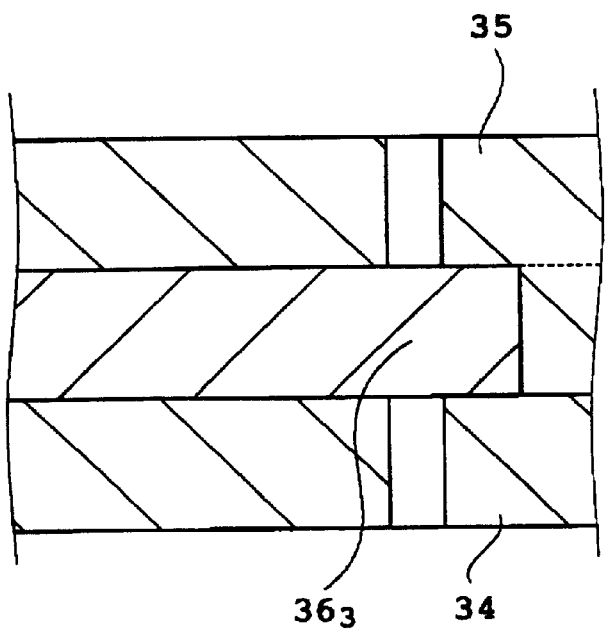
FIG. 9B is a section view of FIG. 9A.
Figure 10A:
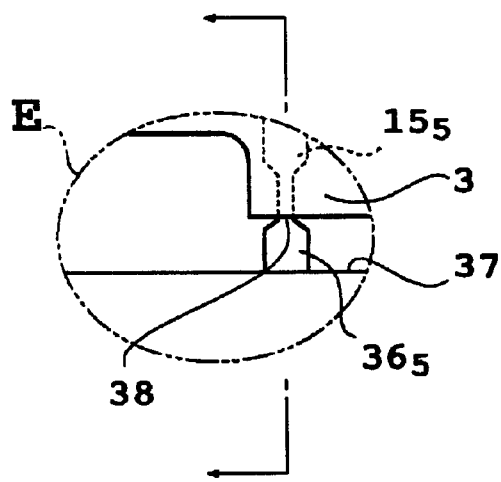
FIG. 10A is an enlarged view of the part E in FIG. 7.
Figure 10B:
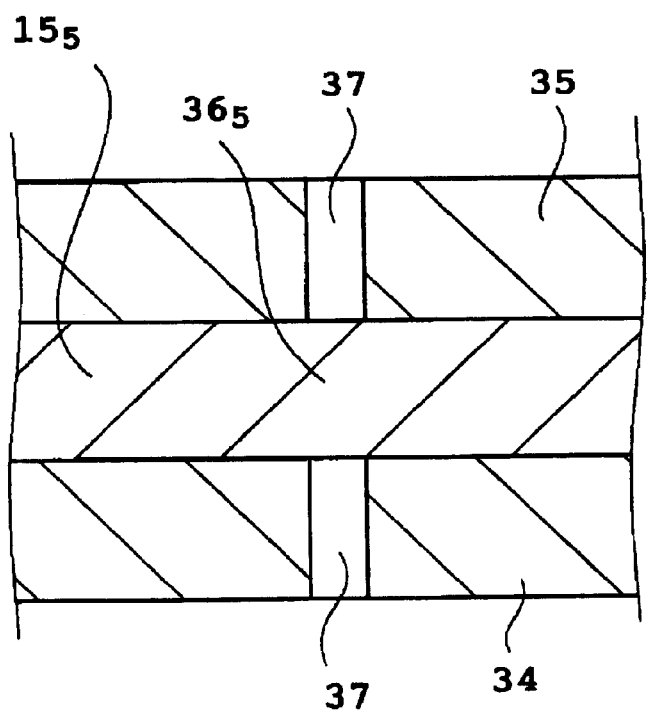
FIG. 10B is a section view of FIG. 10A.
Figure 11A:
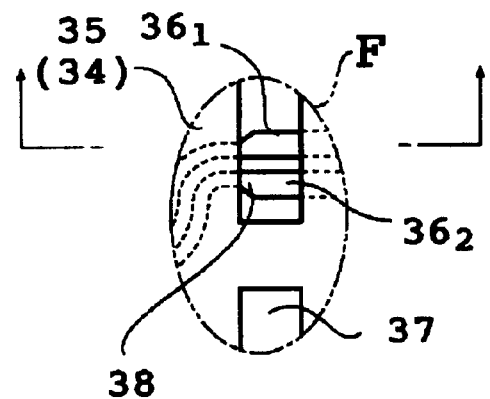
FIG. 11A is an enlarged view of the part F in FIG. 7.
Figure 11B:
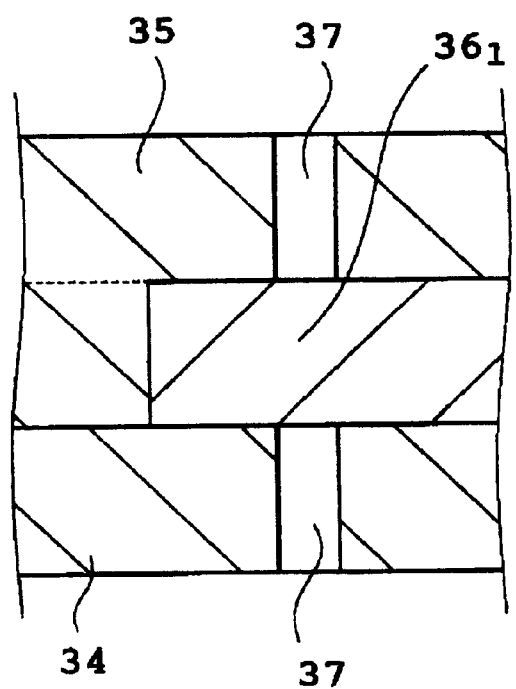
FIG. 11B is a section view of FIG. 11A.

FIG. 6A shows the wiring sheet according to this embodiment of the present invention and FIG. 6B shows a section view of FIG. 6. FIG. 7A and FIG. 7B show enlarged views of major part of one of the flexible wiring board pieces 7 in the wiring sheet.

As FIGS. 6A and 6B show, the wiring sheet 33 according to the embodiment of the present invention has a constitution wherein circuit wiring patterns 13 constituting plural flexible wiring board pieces 7 are formed on an insulating sheet 34 corresponding to the insulating film base 11. On the whole face of the insulating sheet 34, another insulating sheet, i.e., an insulating cover coat layer 35, is provided in such a manner as to coat these circuit wiring patterns 13.

As FIG. 7 shows, the insulating sheet 34 and the insulating cover coat sheet 35 have perforations 37 each in a part corresponding to the periphery of each flexible wiring board piece 7.

Since the circuit wiring pattern 13 constituting the flexible wiring board piece 7 is the same as described above, the same reference numerals are given respectively to the corresponding parts so as to avoid duplicated illustration.

FIGS. 8A, 9A, 10A, 11A and 12A respectively show enlarged views of the parts H, D, E, F and G in FIG. 7 and FIGS. 8B, 9B, 10B, 11B and 12B respectively show section views of FIGS. 8A, 9A, 10A, 11A and 12A.

To produce this wiring sheet 33, plural circuit wiring patterns 13 are first formed by selectively etching (for example, a Cu foil) on the insulating sheet 34. Then a plating layer, such as an Au layer, is formed on each Cu pattern. This Au plating layer is formed on plural Cu patterns at once by electroplating.

In the wiring sheet 33 according to this embodiment of the present invention, therefore, plating lead wires 36 connecting the circuit wiring patterns 13 of flexible wiring board pieces 7 adjacent to each other are formed in an integral style together with the circuit wiring patterns 13.

In this example, plating lead wires $36_1$, $36_2$, $36_3$, $36_4$ and $36_5$ are formed corresponding to the connecting terminal parts $15_1$–$15_4$ and the dummy terminal $15_5$ on one side of the circuit wiring patterns 13 (see FIGS. 9A, 9B, 10A, 11A and 11B). On the other side, plating lead wires $36_6$, $36_7$, $36_8$, and $36_9$ are formed corresponding to the circuit wiring patterns $13_1$–$13_4$ (see FIGS. 12A and 12B).

These plating lead wires 36 [$36_1$–$36_9$] are exposed in both faces at the perforations 37 and narrow parts 38 are formed in the vicinity of the edges in the flexible wiring board piece 7 side.

This wiring sheet 33 can be formed fundamentally in the same manner as the one described above with respect to the formation of the flexible wiring board piece 7 but using the insulating film base 11 and the insulating cover coat layer 14 respectively as substitutes for the insulating sheet 34 and the insulating cover coat layer 35. The perforations 37 can be formed simultaneously with the formation of the openings 20a, 20b, 21a and 21b.

In the wiring sheet 33 according to the embodiment of the present invention, plating lead wires 36 connecting the circuit wiring patterns 13 constituting flexible wiring board pieces 7 adjacent to each other are formed. Thus, a desired metal plating layer, for example, an Au plating layer, can be formed at once by electroplating on all of the circuit wiring patterns 13 in the production process.

In the wiring sheet 33, perforations 37 are formed in a part corresponding to the periphery of each flexible wiring board piece 7 and narrow parts 38 for cutting are formed in the plating lead wires 36 which are exposed in both faces at the perforations 37. Thus, each flexible wiring board piece 7 can be easily separated at the perforations.

In the plating lead wires 36, perforations 37 are formed and, at the same time, narrow parts 38 are formed in the vicinity of the edge of the perforations 37. Thus, the plating lead wires 36 can be easily cut off.

The circuit wiring patterns in the above-described example may each consist of one or plural wires.

Although the present invention is applied to flexible wiring board pieces for hard disk drive units and a wiring sheet having plural number of these flexible wiring board pieces aligned thereon in this mode of the embodiment, the present invention is also applicable to flexible wiring board pieces to be used other electronic instruments and wiring sheets having plural flexible wiring board pieces aligned thereon.

The flexible wiring board piece according to the present invention has the connecting terminal parts of the circuit wiring patterns and the cut parts of the circuit wiring patterns located apart from the connecting terminals part and the connecting terminals parts and the cut parts are exposed in both faces respectively in the openings formed in the insulating film. When an undesired part of the flexible wiring board piece is cut off at the cut parts, therefore, the connecting terminal parts are not scattered and thus a short circuit among the terminal connecting parts and a short circuit between a connecting terminal part and another part can be prevented.

By forming the narrow parts for cutting in the cut parts of the circuit wiring patterns, a flexible wiring board piece can be easily cut.

When these narrow parts for cutting are formed in the vicinity of the opening edges of the insulating film, no flash, etc. is formed at the cutting treatment and thus short circuits in the cut parts of the circuit wiring patterns can be surely prevented.

In the wiring sheet according to the present invention, metal plating can be performed at once on all of the circuit wiring patterns constituting plural flexible wiring board pieces. Thus, a wiring sheet having plural flexible wiring board pieces aligned thereon can be easily produced.

By perforating the parts corresponding to the periphery of each flexible wiring board piece and forming the narrow parts for cutting in the plating lead wires, each flexible wiring board piece can be easily separated from the wiring sheet by hand.

Since the plating lead wires are exposed in both faces in the perforated parts, the plating lead wires can be easily cut off along the perforations, which further facilitates the separation of the flexible wiring board piece.

What is claimed is:

1. A flexible wiring board piece, comprising:
   at least one circuit wiring pattern made of a conductor foil and having a connecting terminal part; and
   insulating films formed so as to coat both faces of said circuit wiring pattern and each having a first opening for exposing both faces of the connecting terminal part of said circuit wiring pattern and a second opening for exposing both faces of a cut part of said circuit wiring pattern at a site apart from said first opening.

2. The flexible wiring board piece as claimed in claims 1, wherein a narrow part for cutting is formed in the cut part of said circuit wiring pattern facing the second opening of said insulating film.

3. The flexible wiring board piece as claimed in claim 2, wherein said narrow part for cutting is formed in the vicinity of the opening edges of said insulating films.

4. A wiring sheet, comprising:
   a circuit wiring pattern having plural patterns constituting at least one flexible wiring board piece made of a conductor foil and having a connecting terminal part;
   insulating sheets formed so as to coat both faces of said circuit wiring pattern and having perforations in a part corresponding to a periphery of said flexible wiring board piece; and
   a plating lead wiring for electrically connecting said circuit wiring pattern being exposed on both faces thereof and having a narrow part for cutting in the exposed part.

5. The wiring sheet as claimed in claim 4, wherein said plating lead wire is formed in said perforated part.

6. The wiring sheet as claimed in claim 4, wherein said circuit wiring pattern further comprises a first opening for exposing both faces of said connecting terminal part and a second opening for exposing both faces of the cut part of said circuit wiring pattern at a site apart from said first opening.

7. The wiring sheet as claimed in claim 5, wherein said circuit wiring pattern further comprisess a first opening for exposing both faces of said connecting terminal part and a second opening for exposing both faces of the cut part of said circuit wiring pattern at a site apart from said first opening.

8. The wiring sheet as claimed in claim 4, wherein a narrow part for cutting is formed in the cut part of said circuit wiring pattern facing the second opening of said insulating sheets.

9. The wiring sheet as claimed in claim 5, wherein a narrow part for cutting is formed in the cut part of said circuit wiring pattern facing the second opening of said insulating sheets.

10. The wiring sheet as claimed in claim 6, wherein a narrow part for cutting is formed in the cut part of said circuit wiring pattern facing the second opening of said insulating sheets.

11. The wiring sheet as claimed in claim 7, wherein a narrow part for cutting is formed in the cut part of said circuit wiring pattern facing the second opening of said insulating sheets.

12. The wiring sheet as claimed in claim 8, wherein said narrow part for cutting is formed in the vicinity of the opening edges of said insulating sheets.

13. The wiring sheet as claimed in claim 9, wherein said narrow part for cutting is formed in the vicinity of the opening edges of said insulating sheets.

14. The wiring sheet as claimed in claim 10, wherein said narrow part for cutting is formed in the vicinity of the opening edges of said insulating sheets.

15. The wiring sheet as claimed in claim 11, wherein said narrow part for cutting is formed in the vicinity of the opening edges of said insulating sheets.

* * * * *